(12) United States Patent
Chou

(10) Patent No.: US 7,152,135 B2
(45) Date of Patent: Dec. 19, 2006

(54) PC CARDBUS STRUCTURE

(75) Inventor: Mu-Kai Chou, Taipei (TW)

(73) Assignee: AVLAB Technology Inc., Taipei (TW)

( * ) Notice: Subject to any disclaimer, the term of this patent is extended or adjusted under 35 U.S.C. 154(b) by 67 days.

(21) Appl. No.: 10/809,405

(22) Filed: Mar. 26, 2004

(65) Prior Publication Data

US 2005/0216628 A1  Sep. 29, 2005

(51) Int. Cl.
*G06F 13/36* (2006.01)
*H01R 24/00* (2006.01)
*G06F 13/38* (2006.01)

(52) U.S. Cl. ............ 710/315; 710/301; 235/441; 361/683; 439/676

(58) Field of Classification Search .......... 710/20, 710/301, 305, 315; 361/679, 683; 439/638, 439/676, 946; 235/441
See application file for complete search history.

(56) References Cited

U.S. PATENT DOCUMENTS

| | | | |
|---|---|---|---|
| 5,596,562 A * | 1/1997 | Chen | 710/315 |
| 6,488,542 B1 * | 12/2002 | Laity | 439/676 |
| 6,922,738 B1 * | 7/2005 | Drescher et al. | 710/20 |
| 6,941,405 B1 * | 9/2005 | Morrow | 710/305 |
| 2004/0201952 A1 * | 10/2004 | Lin | 361/679 |
| 2005/0051626 A1 * | 3/2005 | Hsiao | 235/441 |
| 2005/0168925 A1 * | 8/2005 | Fang et al. | 361/683 |
| 2005/0182881 A1 * | 8/2005 | Chou et al. | 710/301 |

\* cited by examiner

*Primary Examiner*—Christopher E. Lee
(74) *Attorney, Agent, or Firm*—Troxell Law Office, PLLC

(57) ABSTRACT

The present invention relates to a PC CardBus structure arranged on a PC CardBus, which has a computer connection port on one side of the body for connecting a notebook computer, a tablet PC, or other devices and has an outer body on the other side that comprises at least one plug-in port providing connection to at least one peripheral. Instead on the same side with the plug-in ports as seen in the conventional products, the power port of the present invention is arranged on a bump at the outer body of the PC CardBus so that the power cord will not be interfered with the connection cables of other peripherals when plugging in.

5 Claims, 2 Drawing Sheets

PC CARDBUS STRUCTURE

BACKGROUND OF THE INVENTION

1. Field of the Invention

The present invention relates to a PC CardBus structure, and more particularly, to a structure of PC CardBus for notebook computers that integrates at least one PC CardBus.

2. Description of the Prior Art

The standard of conventional PC Card for notebook computers has a long history. In the early 90's, ISA was set as the standard of the internal transferring bus with a mere 16 MB/s theoretical transferring rate. Later, a PCI standard of a 32-bit CardBus as the transferring bus was set and has never been replaced until now. However, the transferring rate and size of the current standard of CardBus are no longer suitable for the needs nowadays. Replacing the current CardBus standard with a new specification is urgently needed.

The PCMCIA society officially announced the Express-Card to replace the CardBus standard of the conventional PC Card in this year's IDF. The most important feature of the ExpressCard is its high compatibility with PCI Express and USB 2.0. Being different from the CardBus based on PCI, ExpressCard does not need an extra controller if a system is supported with the PCI Express 1x or USB 2.0 and the connector can be integrated onto the motherboard with a mere 26 pins. Compared with a CardBus with 68 pins and an extra controller with 200 pins, the production cost of the ExpressCard can be significantly reduced. The transferring rate of the PCI Express 1x already reaches 300 MB/S, which outperforms current PCI buses and becomes the new generation of the high-speed transferring interface for notebook computers.

Please refer to FIG. 1, which is a 3-D schematic drawing of a conventional PC CardBus 1. The PC CardBus comprises a body 11, one end of which has a computer connection port 12 while the other end has an outer body 13. One side of the outer body has a first plug-in port 14, a second plug-in port 15, and a power port 16. The first or second plug-in port is capable of plugging in external peripherals which interface can be an IEEE 1394, a USB, or other interfaces. Since the power port is arranged between those two plug-in ports, interference can occur between connection cables so that the power cord or the connection cables may be loosen when they are all connected at the same time and the Card Bus may malfunction.

SUMMARY OF THE INVENTION

To solve the above-mentioned problem in the prior art, the primary object of the present invention of a PC CardBus structure is to provide a PC CardBus with the power port arranged in a pit at one side of the outer body instead of at the same side of the plug-in ports, so that the power cord and the connection cables of the peripherals will not interfere with each other.

The other object of the present invention is to increase the space between the plug-in ports to accommodate larger peripheral connectors (ex.: USB Flash drive) so that the connected peripherals will not interfere with each other, nor to be be able to even plug in.

The third object of the PC CardBus structure of the present invention is that the structure is not only applied to notebook computers, but also tablet PC, PC, or other devices with CardBus ports.

To achieve the above-mentioned objects, the present invention comprises: a PC CardBus structure arranged on a PC CardBus, wherein an electronic device is connected to the body through a plug-in port on one side. The other side of the body is an outer body, which comprises: at least one plug-in port capable of receiving at least one peripheral; the power port of which, not like in prior art being arranged at the same side with the plug-in ports, is arranged at a bump on the outer body of the PC CardBus so that the power cord and the connection cables of peripherals will not interfere with each other.

To further describe the present invention, drawings and detailed description of the preferred embodiment are presented.

DETAILED DESCRIPTION OF THE PREFERRED EMBODIMENTS

The main object of the present invention is to provide a PC CardBus structure for notebook computers, tablet PC, PC, or other devices with CardBus plug-in ports that eliminates the interference caused by the power cord, the external devices or the connection cables of the external devices commonly seen in the current commercial products, on which the power port is arranged on the same side with the plug-in ports at the outer edge of the outer body. By altering the design structure so that the power port is arranged in a pit at the inner side of the upper CardBus and the opening of the port pointing sideway, the power cord can be easily connected without interfering with other external devices.

Figure 1:
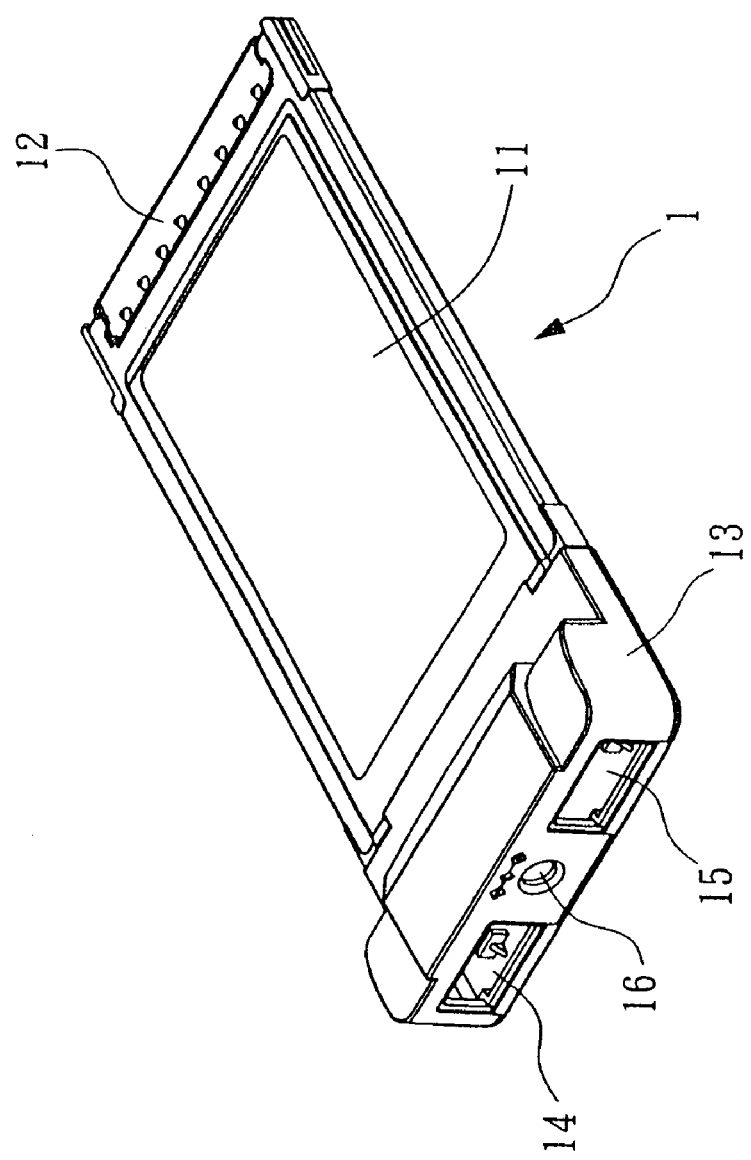
FIG. 1 is a 3-D schematic drawing of a PC CardBus of the prior art.
Figure 2:
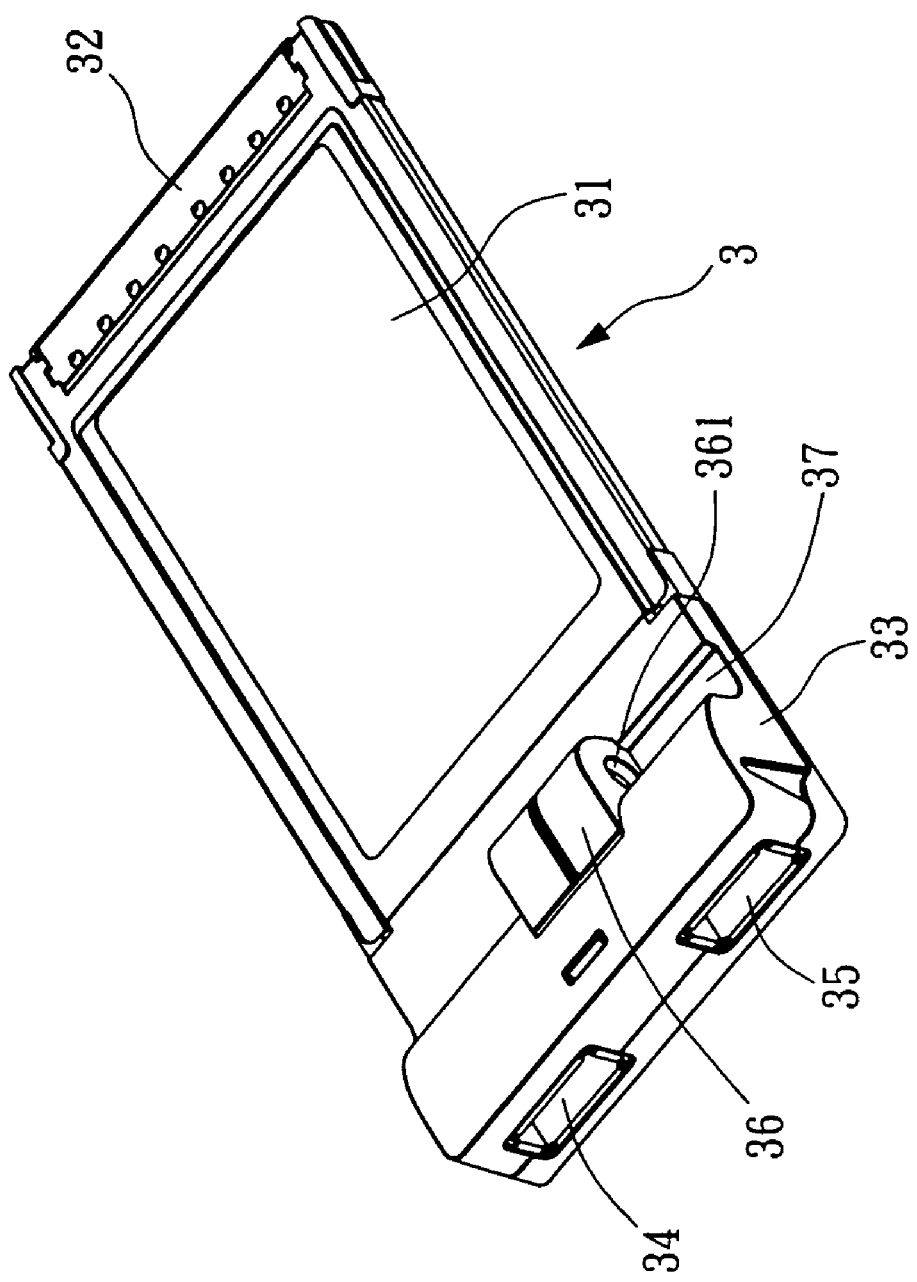
FIG. 2 is a 3-D schematic drawing of a PC CardBus of the present invention.

Please refer to FIG. 2, which is a 3-D schematic drawing of a PC CardBus of the present invention. The PC CardBus 3 comprises a body 31, which has a computer plug-in port 32 on one side and an outer body 33 on the other side. The outer body 33 has a first plug-in port 34 and a second plug-in port 35 arranged on one side. The interface of the first plug-in port 34 or the second plug-in port 35 can be either an IEEE 1394 interface, a USB interface, a LAN interface, a serial ATA interface, or other interfaces. Moreover, the space between the plug-in ports on the PC CardBus 3 is increased to accommodate the larger peripheral connectors seen nowadays (ex.: USB Flash drive) so that the connected devices will not interfere with each other or not be able to even plug in. This technique can be applied to an outer body designed with a plurality of plug-in ports and will have the same features.

In addition, a bump 36 is arranged on the upper side of the outer body 31 of the PC CardBus 3. The power port 361 is arranged on one side of the bump 36 and a trench 37 extending from the power port 361 is arranged to provide the guidance of the power cord terminal (not shown) while plugging. The convenience of plugging the power cord without interfering other external devices is the main technical feature of the present invention.

According to the description, the structural feature and the preferred embodiment of the present invention are described. The objects and advantages of the present invention are unique and important, which are essential to patent the invention.

What is claimed is:

1. A PC CardBus structure arranged on a PC CardBus, wherein a body of the PC CardBus has a connection port on one side thereof to connect to an electronic device and has an outer body on the other side, the outer body comprising: at least one plug-in port for receiving at least one peripheral, wherein a power port is arranged on a bump at the outer body of the PC CardBus so that a power cord will not interfere with connection cables of other peripherals when plugging in, wherein an interface of the plug-in port is a serial ATA interface.

2. The PC Card Bus structure of claim 1, wherein the bump of the outer body has an extending trench for providing guidance of the power cord terminal while plugging in.

3. The PC CardBus structure of claim 1, wherein the electronic device is a notebook computer.

4. The PC CardBus structure of claim 1, wherein the electronic device is a tablet PC.

5. The PC Card Bus structure of claim 1, wherein the electronic device is a PC.

* * * * *